United States Patent
Breitwisch et al.

(10) Patent No.: US 8,383,501 B2
(45) Date of Patent: Feb. 26, 2013

(54) VERTICAL FIELD EFFECT TRANSISTOR ARRAYS AND METHODS FOR FABRICATION THEREOF

(75) Inventors: Matthew J. Breitwisch, Yorktown Heights, NY (US); Chung H. Lam, Peekskill, NY (US); Alejandro G. Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/185,055

(22) Filed: Jul. 18, 2011

(65) Prior Publication Data
US 2011/0275209 A1 Nov. 10, 2011

Related U.S. Application Data (62) Division of application No. 12/541,495, filed on Aug. 14, 2009, now Pat. No. 7,981,748, which is a division of application No. 11/516,208, filed on Sep. 6, 2006, now Pat. No. 7,825,460.

(51) Int. Cl.
*H01L 21/28* (2006.01)
(52) U.S. Cl. . 438/589; 438/595; 257/331; 257/E29.131; 257/E21.419; 257/E21.428
(58) Field of Classification Search .................. 438/589
See application file for complete search history.

(56) References Cited

U.S. PATENT DOCUMENTS

| | | | |
|---|---|---|---|
| 5,945,707 A | 8/1999 | Bronner et al. | |
| 5,990,509 A | 11/1999 | Burns et al. | |
| 6,410,958 B1 | 6/2002 | Usui et al. | |
| 6,461,900 B1 | 10/2002 | Sundaresan et al. | |
| 6,544,874 B2 | 4/2003 | Mandelman et al. | |
| 7,271,063 B2 | 9/2007 | Chung-Zen | |
| 7,476,933 B2 | 1/2009 | Juengling | |
| 7,745,319 B2 | 6/2010 | Tang et al. | |
| 2002/0074585 A1 | 6/2002 | Tsang et al. | |
| 2002/0175365 A1 | 11/2002 | Hirayama | |
| 2004/0233769 A1 | 11/2004 | Matsuoka et al. | |
| 2005/0095767 A1 | 5/2005 | Tang et al. | |
| 2005/0186740 A1 | 8/2005 | Kim | |
| 2005/0277249 A1 | 12/2005 | Juengling | |
| 2006/0046407 A1 | 3/2006 | Juengling | |
| 2006/0097304 A1 | 5/2006 | Yoon et al. | |
| 2007/0082448 A1 | 4/2007 | Kim et al. | |
| 2007/0108528 A1* | 5/2007 | Anderson et al. ............. | 257/365 |
| 2007/0290258 A1 | 12/2007 | Son et al. | |

OTHER PUBLICATIONS

Office Action dated May 12, 2011, received in a related U.S. Patent Application, namely U.S. Appl. No. 12/851,232.
Sunouchi, K. et al., "A Surrounding Gate Transistor (SGT) Cell for 64/256 Mbit DRAMs", Electron Devices Meeting, IEDM '89, Technical Digest, Dec. 1989, pp. 23-26, English-language abstract only.
Endoh et al., "Novel Ultrahigh-Density Flash Memory With a Stacked-Surrounding Gate Transistor (S-SGT) Structured Cell," IEEE Trans. on Electron Devices, 50(4), Apr. 2003, pp. 945-951.

(Continued)

*Primary Examiner* — Calvin Lee
*Assistant Examiner* — Abul Kalam
(74) *Attorney, Agent, or Firm* — Scully, Scott, Murphy & Presser, P.C.; Vazken Alexanian (57) ABSTRACT

Vertical field effect transistor semiconductor structures and methods for fabrication of the vertical field effect transistor semiconductor structures provide an array of semiconductor pillars. Each vertical portion of each semiconductor pillar in the array of semiconductor pillars has a linewidth greater than a separation distance to an adjacent semiconductor pillar. Alternatively, the array may comprise semiconductor pillars with different linewidths, optionally within the context of the foregoing linewidth and separation distance limitations. A method for fabricating the array of semiconductor pillars uses a minimally photolithographically dimensioned pillar mask layer that is annularly augmented with at least one spacer layer prior to being used as an etch mask.

15 Claims, 7 Drawing Sheets

OTHER PUBLICATIONS

Endoh et al, "2.4F2 Memory Cell Technology with Stacked-Surrounding Gate Transistor (S-SGT) DRAM," IEEE Trans. on Electron Devices, 45(8) Aug. 2001, pp. 1599-1603.

Hioki et al., "An Analysis of Program and Erase Operations for FC-SGT Flash Memory Cells," 0-7803-6279-9/00, IEEE 2000, pp, 116-118.

Takato et al., "High Performance CMOS Surrounding Gate Transistor (SGT) for Ultra High Density LSIs," IEEE IEDM 1988, pp. 222-225.

Notice of Allowance dated Oct. 6, 2011 received in a related U.S. Patent Application, namely U.S. Appl. No. 12/851,232.

* cited by examiner

FIG. 21 ered to U.S. Ser. No. 12/851,232 filed on Aug. 5, 2010.
VERTICAL FIELD EFFECT TRANSISTOR ARRAYS AND METHODS FOR FABRICATION THEREOF

CROSS-REFERENCE TO RELATED APPLICATIONS

This application is a divisional of U.S. Ser. No. 12/541,495, filed Aug. 14, 2009, now U.S. Pat. No. 7,981,748, which is a divisional of U.S. Ser. No. 11/516,208, filed Sep. 6, 2006, now U.S. Pat. No. 7,825,460, the entire contents of which are incorporated herein by reference. This application is also related to U.S. Ser. No. 12/851,232 filed on Aug. 5, 2010.

BACKGROUND

The invention relates generally to vertical field effect transistors. More particularly, the invention relates to vertical field effect transistor arrays with enhanced performance.

Planar field effect transistors are common devices in the semiconductor fabrication art. Planar field effect transistors are readily fabricated as complementary doped pairs using self aligned methods that use a gate electrode as a self aligned mask for forming source/drain regions into a semiconductor substrate. Planar field effect transistors have been successfully scaled for several decades to increasingly smaller lateral and transverse linewidth dimensions (i.e., linewidth dimensions that are within a plane of a planar transistor, rather than vertical to the plane of the planar transistor).

A recent trend in field effect transistor design and fabrication that competes with the continued trend in planar field effect transistor device scaling is the design and fabrication of vertical field effect transistor devices. In comparison with a planar field effect transistor device where a gate electrode covers a planar channel within a semiconductor substrate, a vertical field effect transistor device, in a first instance, comprises a semiconductor pillar, a horizontal top region of which and a horizontal region at the base of which typically comprise source/drain regions. A circumference of the pillar and a height of the pillar define a channel area within the semiconductor pillar. A vertical field effect transistor may thus benefit from an offset in scaling in a vertical direction with respect to a horizontal direction (i.e., as a pillar linewidth is scaled to a narrower linewidth dimension a pillar height may be increased to maintain a constant vertical field effect transistor channel area). Such an offset in scaling is not achievable for a planar field effect transistor since scaling of such a planar device occurs in both a lateral planar direction and a transverse planar direction.

While vertical field effect transistor devices thus have advantage in comparison with planar field effect transistor devices, vertical field effect transistor devices are nonetheless not entirely without problems. In particular, vertical field effect transistor devices do not always provide optimal channel properties for use in multiple applications.

Various vertical field effect transistor device structures and methods for fabrication thereof are known in the semiconductor fabrication art.

For example, Takato et al., in "High Performance CMOS Surrounding Gate Transistor (SGT) for Ultra High Density LSIs," IEEE IEDM 1988, pp. 222-25, teaches a surrounding gate transistor (SGT) with source/drain regions located at a top of a semiconductor pillar and at a floor of a semiconductor substrate adjoining the semiconductor pillar. This particular prior art reference contemplates circuit area reductions of 50% when using the foregoing surrounding gate transistor (SGT) in comparison with a planar transistor when fabricating a circuit.

In addition, Hioki et al., in "An Analysis of Program and Erase Operations for FC-SGT Flash Memory Cells," 0-7803-6279-9/00, IEEE 2000, pp, 116-18, teaches a floating channel surrounding gate transistor (FC-SGT) that realizes high speed bipolarity program and erase operations. The floating channel surrounding gate transistor (FC-SGT) comprises a semiconductor pillar comprising source/drain regions at a top region and a bottom region of the semiconductor pillar, and separated by a channel region within a central portion of the semiconductor pillar.

Further, Endoh et al., in: (1) "2.4F2 Memory Cell Technology with Stacked-Surrounding Gate Transistor (S-SGT) DRAM," IEEE Trans. on Electron Devices, 45(8) August 2001, pp. 1599-1603; and (2) "Novel Ultrahigh-Density Flash Memory With a Stacked-Surrounding Gate Transistor (S-SGT) Structured Cell," IEEE Trans. on Electron Devices, 50(4), April 2003, pp 945-51, each teach the use of a stacked-surrounding gate transistor (S-SGT) in memory cell applications. The stacked-surrounding gate transistor comprises a semiconductor pillar that has a stepped sidewall to accommodate separate components within the memory cell applications.

Still further, Matsuoka, et al, in U.S. Pub. No. 2004/0233769, teaches a semiconductor memory cell and method for fabrication of the semiconductor memory cell. The semiconductor memory cell uses a vertical select transistor configured within the context of a $4F^2$ structure in order to avoid a large memory cell area.

Finally, Kim, in U.S. Pub. No. 2005/0186740 teaches a vertical field effect transistor structure and a method for fabricating the vertical field effect transistor structure. The vertical memory cell also comprises a $4F^2$ structure that maximizes semiconductor substrate area utilization.

Semiconductor structure and device dimensions are certain to continue to decrease and, as a result thereof, semiconductor structures that are readily scalable absent compromise in performance characteristics are desirable. To that end, also desirable are vertical field effect transistor devices and arrays such as surrounding gate transistor (SGT) devices and arrays, and methods for fabrication of the devices and arrays, that allow for enhanced flexibility and performance of the vertical field effect transistor devices and arrays.

BRIEF SUMMARY

The invention comprises semiconductor structures comprising vertical field effect transistor arrays such as a surrounding gate transistor (SGT) arrays, and methods for fabricating the semiconductor structures. The semiconductor structures comprise a plurality of semiconductor pillars, optionally of different linewidths. All vertical portions of each semiconductor pillar have a semiconductor pillar linewidth greater than a separation distance from an adjacent semiconductor pillar.

Methods for fabricating the semiconductor structures use a minimally photolithographically dimensioned pillar mask layer that is annularly augmented.

A vertical field effect transistor array semiconductor structure in accordance with the invention includes a plurality of semiconductor pillars. Within the semiconductor structure, all vertical portions of each semiconductor pillar have a semiconductor pillar linewidth greater than a separation distance from an adjacent semiconductor pillar.

Another vertical field effect transistor array semiconductor structure in accordance with the invention also includes a plurality of semiconductor pillars, where all vertical portions of each semiconductor pillar have a semiconductor pillar linewidth greater than a separation distance from an adjacent semiconductor pillar. Within this other semiconductor structure, at least one semiconductor pillar has a first linewidth and at least one other semiconductor pillar has a second linewidth different than the first linewidth.

A method for fabricating a vertical field effect transistor array semiconductor structure in accordance with the invention includes forming a plurality of identically sized mask layers located upon a semiconductor substrate. This particular method also includes annularly augmenting each of the plurality of identically sized mask layers to provide a plurality of annularly augmented mask layers upon the semiconductor substrate. This particular method also includes etching at least an initial portion of the semiconductor substrate while using the plurality of annularly augmented mask layers as an etch mask to provide a plurality of semiconductor pillars within an etched semiconductor substrate.

Another method for fabricating a vertical field effect transistor array semiconductor structure includes forming at least one first mask layer having a first diameter and at least one second mask layer having a second diameter different from the first diameter upon a semiconductor substrate. This particular method also includes etching the semiconductor substrate while using the first mask layer and the second mask layer as an etch mask layer to provide a corresponding first semiconductor pillar having a first linewidth and a second semiconductor pillar having a second linewidth different from the first linewidth.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein.

DETAILED DESCRIPTION

The invention, which includes vertical field effect transistor arrays, such as surrounding gate transistor (SGT) arrays, and methods for fabricating the vertical field effect transistor arrays, is understood within the context of the description provided below. The description provided below is understood within the context of the drawings described above. Since the drawings are intended for illustrative purposes, the drawings are not necessarily drawn to scale.

FIG. 1 to FIG. 10 show a series of schematic cross-sectional and schematic plan-view diagrams illustrating the results of progressive stages in fabricating a semiconductor structure in accordance with an embodiment of the invention. This particular embodiment of the invention comprises a first embodiment of the invention. The semiconductor structure whose schematic cross-sectional and schematic plan-view diagrams are illustrated in FIG. 1 to FIG. 10 comprises a vertical field effect transistor device array, and in particular a surrounding gate transistor (SGT) array.

Figure 1:
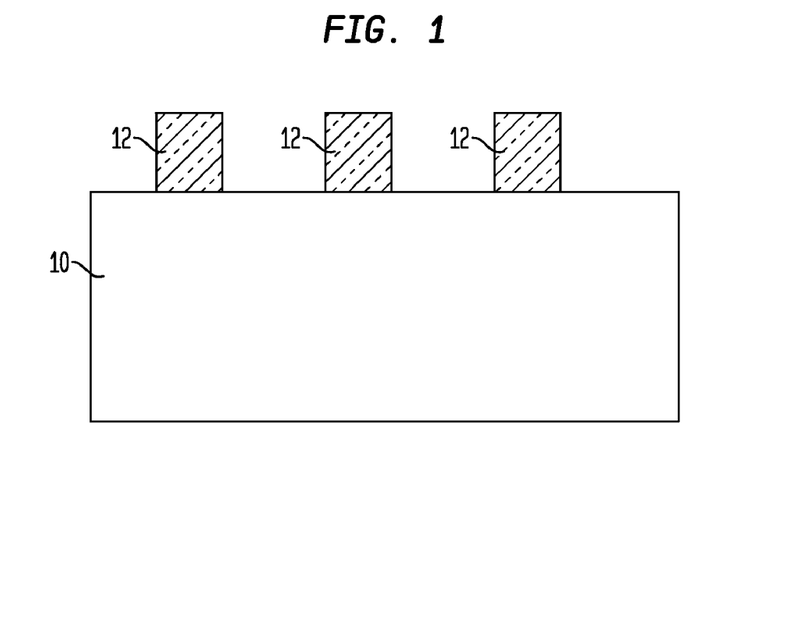
FIG. 1 to FIG. 10 show a series of schematic cross-sectional and plan-view diagrams illustrating the results of progressive stages in fabricating a semiconductor structure comprising a vertical field effect transistor array in accordance with an embodiment of the invention. This vertical field effect transistor array comprises a surrounding gate transistor (SGT) array.

FIG. 1 shows a schematic cross-sectional diagram of the semiconductor structure at an early stage of the fabrication of the vertical field effect transistor array therein in accordance with the first embodiment.

FIG. 1 shows a semiconductor substrate 10. A plurality of first pillar mask layers 12 is located upon the semiconductor substrate 10.

The semiconductor substrate 10 may comprise any of several semiconductor materials that are conventional or unconventional in the semiconductor fabrication art. The semiconductor materials may include, but are not limited to: silicon, germanium, silicon-germanium alloy, silicon carbide, silicon-germanium carbide alloy and compound semiconductor materials. Non-limiting examples of compound semiconductor materials include gallium arsenide, indium arsenide and indium phosphide semiconductor materials. Typically, the semiconductor substrate 10 comprises a silicon or silicon-germanium alloy semiconductor material that has a thickness from about 0.5 to about 1.5 mm.

The first pillar mask layers 12 may comprise any of several mask materials. Included, but not limiting, are photoresist mask materials, as well as hard mask materials. Hard mask materials are generally more common. Non-limiting examples of hard mask materials include oxides, nitrides and oxynitrides of silicon. Oxides, nitrides and oxynitrides of other elements are not excluded. When the first pillar mask layers 12 comprise a hard mask material, the first pillar mask layers 12 are typically patterned from a blanket hard mask material layer while using generally conventional photolithographic methods. Such generally conventional photolithographic methods will typically use a photoresist layer as an etch mask for patterning the first pillar mask layers 12 from the corresponding blanket hard mask material layer.

The blanket hard mask material layer may be formed using any of several methods that are appropriate to the materials of composition of the blanket hard mask material layer. Non-limiting examples include thermal or plasma oxidation or nitridation methods, chemical vapor deposition methods and physical vapor deposition methods. Typically, the blanket hard mask material layer comprises a silicon oxide or silicon nitride hard mask material (e.g., generally a silicon oxide hard mask material) that has a thickness from about 500 to about 1000 angstroms.

Figure 2:
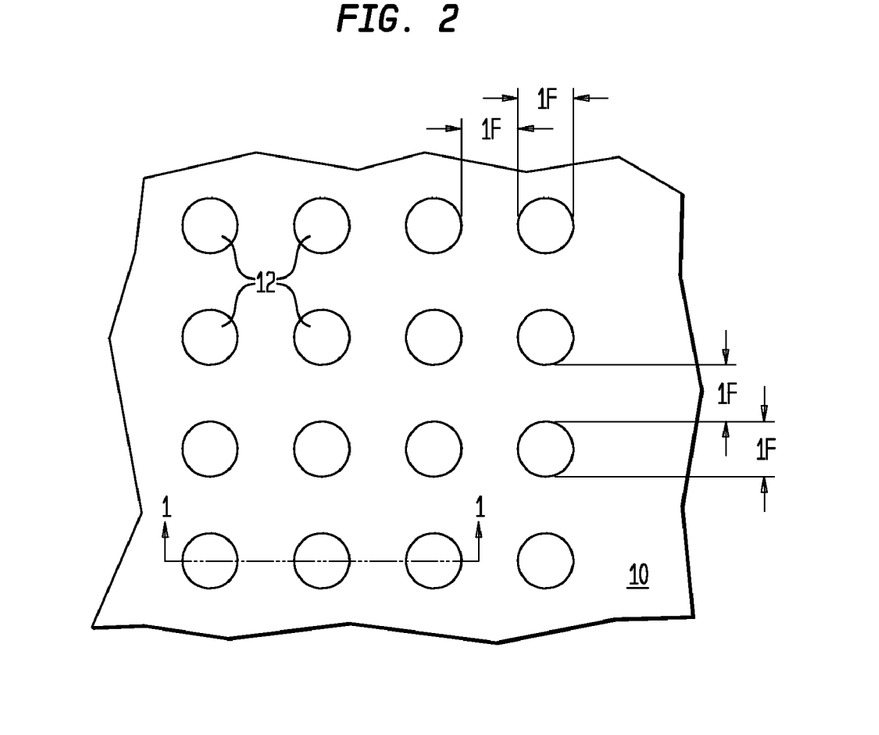

FIG. 2 shows a schematic plan-view diagram illustrating an array of first pillar mask layers 12 including the first pillar mask layers 12 that are illustrated specifically within the schematic cross-sectional diagram of FIG. 1. As is illustrated within the schematic plan-view diagram of FIG. 2, each first pillar mask layer 12 is circular in shape, although neither the embodiment, nor the invention, is limited to pillar mask layers that are circular in shape. Each first pillar mask layer 12 has a diameter (i.e., linewidth) equal to 1F, as well as a separation distance from an adjacent first pillar mask layer 12 that is also equal to 1F. Within the embodiment and the invention, F is equal to a minimum photolithographic resolvable dimension that will vary as a function of a particular photolithographic apparatus.

Thus, as is illustrated in FIG. 2, each first pillar mask layer 12 has a pitch dimension to an adjacent first pillar mask layer 12 of 2F. Further, a diameter of each first pillar mask layer 12 and an adjoining separation distance to an adjacent first pillar mask layer 12 that in an aggregate yield the pitch dimension of 2F, in turn define a vertical field effect transistor cell area of $4F^2$.

Figure 3:
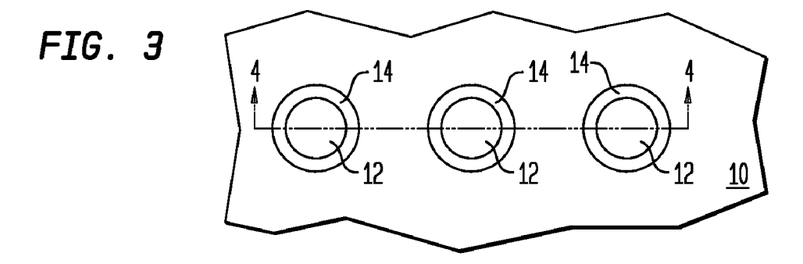
Figure 4:
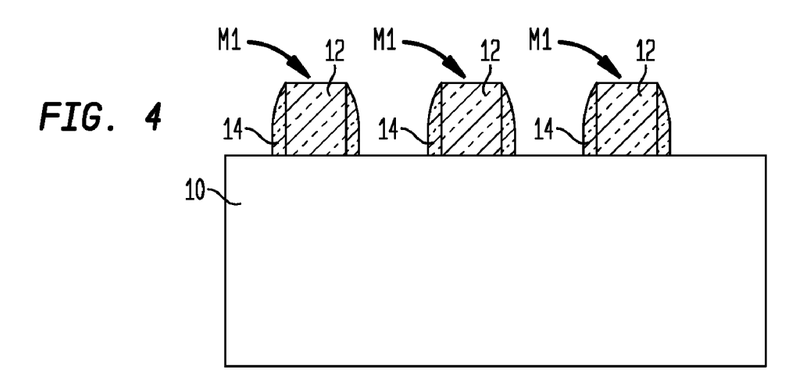

FIG. 3 and FIG. 4 show a schematic plan-view diagram and a schematic cross-sectional diagram illustrating the results of further processing of the semiconductor structure whose schematic cross-sectional diagram is illustrated in FIG. 1 and in-part the semiconductor structure whose schematic plan-view diagram is illustrated in FIG. 2.

FIG. 3 and FIG. 4 illustrate a plurality of first spacer layers 14 each annularly encircling the plurality of first pillar mask layers 12. As is illustrated more specifically in FIG. 4, individual structures comprising a first pillar mask layer 12 and a first spacer layer 14 comprise a first composite mask layer M1.

The plurality of first spacer layers 14 may comprise spacer materials, and be formed using methods, that are conventional in the semiconductor fabrication art. Although the plurality of first spacer layers 14 may comprise any of several spacer materials, including but not limited to, conductor spacer materials, semiconductor spacer materials and dielectric spacer materials; dielectric spacer materials are generally most common. Such dielectric spacer materials may be selected from the same group of dielectric materials from which is comprised the first pillar mask layers 12 when the first pillar mask layers 12 comprise a hard mask material. In accordance with disclosure above, this particular group includes, but is not limited to, oxides, nitrides and oxynitrides of silicon. Oxides, nitrides and oxynitrides of other elements are not excluded.

Typically, the plurality of first spacer layers 14 comprises a dielectric material of composition different than the plurality of first pillar mask layers 12. For example and without limitation, when the plurality of first pillar mask layers 12 comprises a silicon oxide material, the plurality of first spacer layers 14 may comprise a silicon nitride material. Alternative materials compositions for the plurality of first pillar mask layers 12 and the plurality of first spacer layers 14 is also within the context of the instant embodiment.

The plurality of first spacer layers 14 may be formed using a generally conventional blanket spacer material layer deposition and anisotropic etchback method. The anisotropic etchback method is typically a plasma etch method that uses an etchant gas composition that has a specificity for the spacer material from which is comprised the plurality of first spacer layers 14 with respect to a hard mask material from which is typically comprised the plurality of first pillar mask layers 12.

Figure 5:
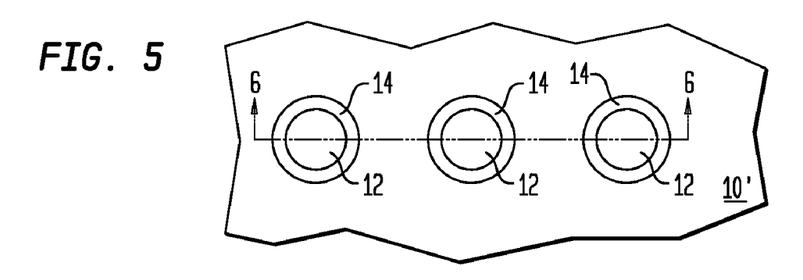
Figure 6:
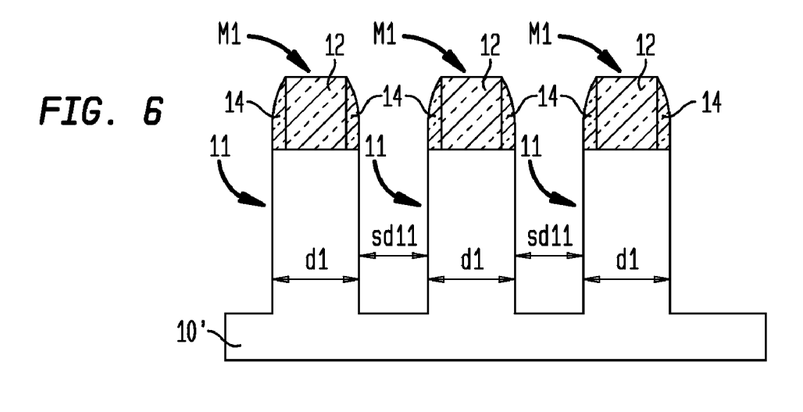

FIG. 5 and FIG. 6 show a schematic plan-view diagram and a schematic cross-sectional diagram that illustrate the results of further processing of the semiconductor structure whose schematic plan-view diagram and schematic cross-sectional diagram are illustrated in FIG. 3 and FIG. 4.

FIG. 5 and FIG. 6 show the results of etching the semiconductor substrate 10 (i.e., at least a top portion of the semiconductor substrate 10 and generally all portions of the semiconductor substrate 10) while using the plurality of first composite mask layers M1 as etch mask layers to provide a plurality of semiconductor pillars 11 located on an etched semiconductor substrate 10'.

As is illustrated within the schematic cross-sectional diagram of FIG. 6, each vertical portion of each semiconductor pillar 11 has a linewidth d1 (i.e., a diameter) equal to F+2s, where s equals an annular linewidth of any one of the plurality of first spacer layers 14. As is further illustrated within FIG. 6, the embodiment intends that each semiconductor pillar 11 comprises substantially straight sidewalls (i.e., having a deviation from true straightness of less than about 20 angstroms, as measured at each semiconductor pillar 11 mid-sidewall), and that the substantially straight sidewalls are preferably perpendicularly oriented, or nearly so (i.e., within about 5 to about 7 degrees of a perpendicular).

As noted above, each vertical portion of each semiconductor pillar 11 has a linewidth d1 that equals F+2s to provide: (1) a widening of a linewidth of a semiconductor pillar 11 with respect to a first pillar mask layer 12; and (2) a corresponding narrowing of a separation distance from one semiconductor pillar 11 to an adjacent semiconductor pillar 11. Such a separation distance from a semiconductor pillar 11 to an adjacent semiconductor pillar 11 is designated in FIG. 6 as sd11, where sd11 equals F−2s.

Such a uniform widening of a semiconductor pillar 11 and a corresponding narrowing of a separation distance between adjacent semiconductor pillars 11 inherently provides (i.e., within the context of the embodiment where each of a first pillar mask layer 12 diameter and a first pillar mask layer 12 separation distance is equal to a minimum photolithographically resolvable linewidth F) that each vertical portion of a semiconductor pillar 11 has a linewidth greater than a separation distance to an adjacent semiconductor pillar 11. In turn, such a uniform widening of a semiconductor pillar 11 linewidth also provides for a more uniform enhancement of a drive current within individual vertical field effect transistor devices that are fabricated using the individual semiconductor pillars 11 as channel regions.

Figure 7:
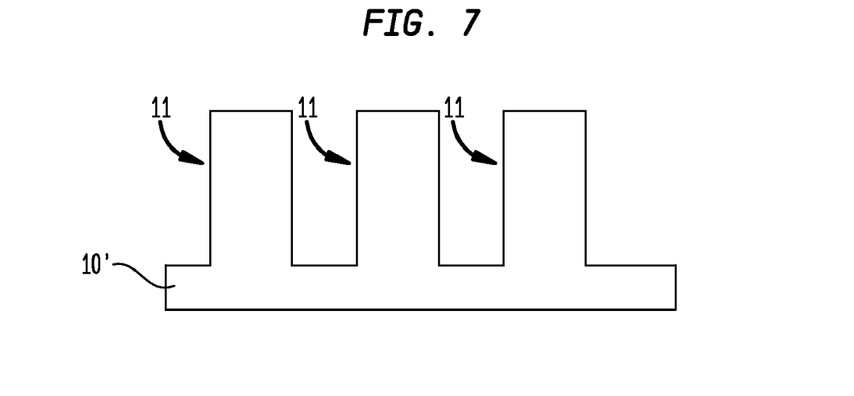

FIG. 7 shows the results of stripping the plurality of first composite mask layers M1 (i.e., comprising the plurality of first spacer layers 14 that surround the plurality of first pillar mask layers 12) from the plurality of semiconductor pillars 11 that is illustrated in FIG. 6. Resulting from the stripping of the plurality of first composite mask layers M1 is the plurality of semiconductor pillars 11 each of which is bare located on the etched semiconductor substrate 10'.

The plurality of first composite mask layers M1 may be stripped using methods and materials that are appropriate to the materials which comprise the plurality of first spacer layers 14 and the plurality of first pillar mask layers 12. Included, but not limiting, are wet chemical stripping methods and dry plasma stripping methods. When using wet chemical stripping methods, hydrofluoric acid etchant materials are commonly used for stripping silicon oxide based materials, and phosphoric acid etchant materials are commonly used for stripping silicon nitride based materials. Certain plasma etch methods may use certain etchant gas compositions that are not specific with respect to silicon oxide materials in comparison with silicon nitride materials.

Figure 8:
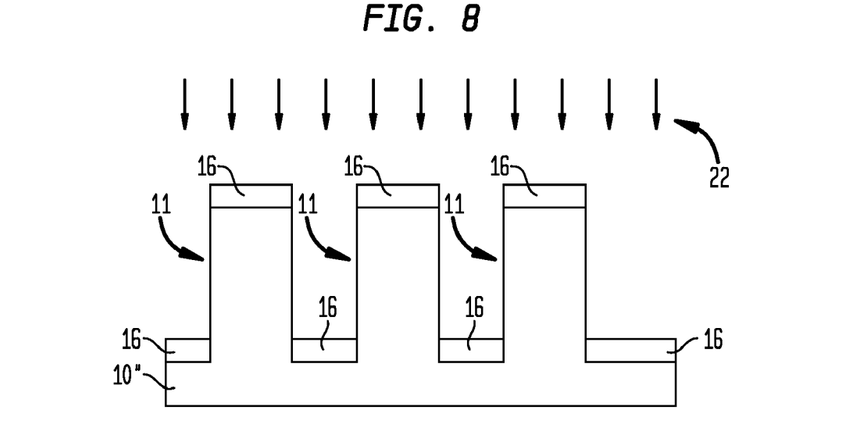

FIG. 8 shows the results of ion implanting the semiconductor structure of FIG. 7 with a dose of dopant ions 22 to form a plurality of source/drain regions 16 at: (1) a plurality of top portions of the semiconductor pillars 11; and (2) a plurality of base portions of the etched semiconductor substrate 10' interposed between the semiconductor pillars 11, (i.e., at the footprint of the semiconductor pillars 11).

The dopant ions 22 are typically provided at a dose from about 5e14 to about 5e15 dopant ions per square centimeter and an ion implantation energy from about 5 to about 20 keV. The foregoing ion implantation conditions provide the source/drain regions 16 with a dopant concentration from about 5e18 to about 5e19 dopant atoms per cubic centimeter.

The dose of dopant ions 22 is provided with a polarity selected to provide a vertical field effect transistor with a desired polarity.

Figure 9:
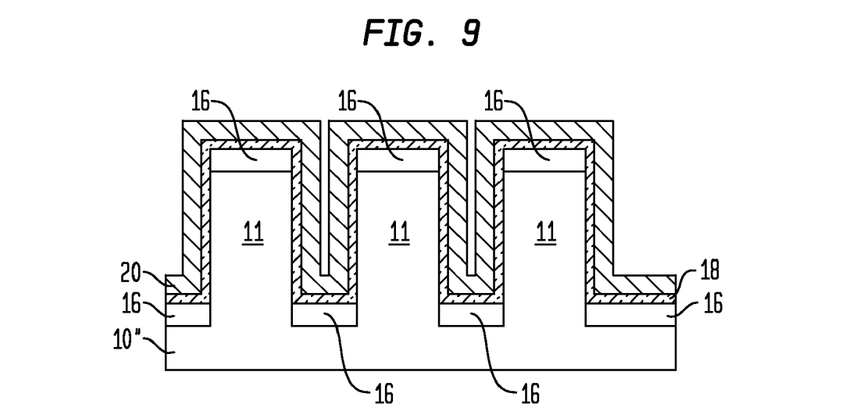

FIG. 9 shows a gate dielectric 18 located and formed conformally upon the semiconductor structure whose schematic cross-sectional diagram is illustrated in FIG. 8, and, in particular, conformally upon the semiconductor pillars 11. FIG. 9 also shows a gate electrode material layer 20 located and formed upon the gate dielectric 18.

The gate dielectric 18 may comprise any of several gate dielectric materials that are conventional or unconventional in the semiconductor fabrication art.

In a first instance, the gate dielectric 18 may comprise a generally conventional gate dielectric material having a dielectric constant from about 4 to about 20, measured in vacuum. Non-limiting examples of such generally conventional gate dielectric materials include oxides, nitrides and oxynitrides of silicon. Oxides, nitrides and oxynitrides of other elements are not excluded.

In a second instance, the gate dielectric 18 may alternatively comprise a generally higher dielectric constant gate dielectric material having a dielectric constant from about 20 to at least about 100, measured in vacuum. Non-limiting examples of these generally higher dielectric constant gate dielectric materials include titanium oxides, lanthanum oxides, hafnium oxides, hafnium silicates, barium-strontium titanates (BSTs) and lead-zirconate titanates (PZTs).

Any of the foregoing gate dielectric materials may be formed using methods that are appropriate to their compositions. Non-limiting examples include thermal or plasma oxidation or nitridation methods, chemical vapor deposition methods (including atomic layer chemical vapor deposition methods) and physical vapor deposition methods (including sputtering methods).

Typically, the gate dielectric 18 comprises a thermal silicon oxide gate dielectric material that has a thickness from about 10 to about 50 angstroms.

The gate electrode material layer 20 may comprise any of several gate electrode materials. Non-limiting examples include certain metals, metal nitrides, metal silicides, doped polysilicon (i.e., having a dopant concentration from about 1e18 to about 1e22 dopant atoms per cubic centimeter) and polycide (doped polysilicon/metal silicide stack) gate electrode materials. The gate electrode material layer 20 may similarly also be formed using any of several methods that are appropriate to the materials of composition of the gate electrode material layer 20. Non-limiting examples include plating methods, chemical vapor deposition methods (including atomic layer chemical vapor deposition methods) and physical vapor deposition methods (including sputtering methods). Typically, the gate electrode material layer 20 comprises a doped polysilicon or metal silicide gate electrode material that has a thickness about one-quarter of a minimum photolithographically resolvable linewidth (i.e., ¼ F, where F is disclosed above within the context of FIG. 2).

Figure 10:
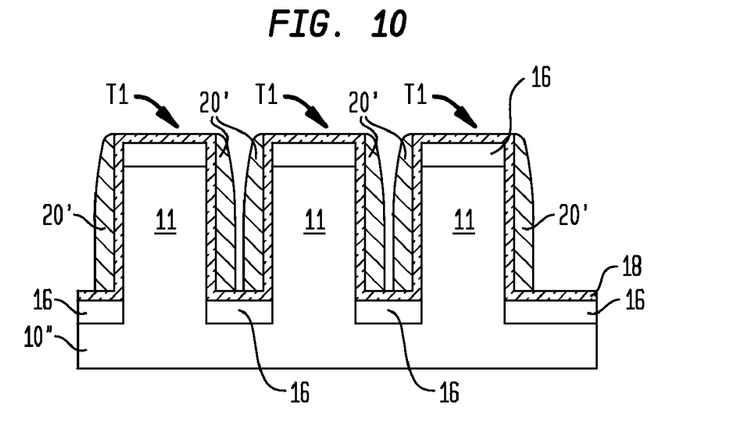

FIG. 10 shows the results of anisotropically etching the gate electrode material layer 20 to form a plurality of gate electrodes 20' intended as annularly surrounding each of the plurality of semiconductor pillars 11.

The foregoing anisotropic etching may be effected using an etchant gas composition appropriate to a material of composition of the gate electrode material layer 20. Chlorine containing etchant gas compositions may be used for many materials of composition. Alternatively, some other gate electrode materials may be anisotropically etched while using a fluorine containing etchant gas composition.

The result of the aforementioned etching is a plurality of vertical field effect transistor devices T1 that provides a surrounding gate transistor (SGT) array. Each vertical field effect transistor device comprises a semiconductor pillar 11 a portion of which comprises a channel region. A gate dielectric 18 is located and formed upon each semiconductor pillar 11. Source/drain regions 16 are located at the tops of the semiconductor pillars 11 and at floor portions of an implanted and etched semiconductor substrate 10" interposed between adjacent pairs of semiconductor pillars 11. Finally, spacer shaped annular surrounding gate electrodes 20' are located upon the gate dielectric 18 and separated from sidewalls of the semiconductor pillars 11 within which are channel regions that separate the source/drain regions 16.

FIG. 10 shows a schematic cross-sectional diagram of a vertical field effect transistor array in accordance with a particular embodiment of the invention that comprises a first embodiment of the invention. The vertical field effect transistor array comprises a plurality of vertical field effect transistor devices T1 (i.e., surrounding gate transistor (SGT) devices). Within the vertical field effect transistor array, each vertical field effect transistor device T1 comprises a semiconductor pillar 11 that is used in part as a channel region. Each vertical portion of the semiconductor pillar 11 has a linewidth greater than a separation distance to an adjacent semiconductor pillar 11. Typically the semiconductor pillar 11 linewidth and the semiconductor pillar 11 separation distance differ by four times an annular first spacer layer 14 linewidth for an annular first spacer layer 14 that is formed annularly surrounding a first pillar mask layer 12.

FIG. 11 to FIG. 21 show a series of schematic cross-sectional diagrams illustrating the results of progressive stages in fabricating a semiconductor structure in accordance with another embodiment of the invention. This other embodiment of the invention comprises a second embodiment of the invention. The semiconductor structure fabricated in accordance with this other embodiment of the invention also comprises a vertical field effect transistor array, and more specifically a surrounding gate transistor (SGT) array.

Figure 11:
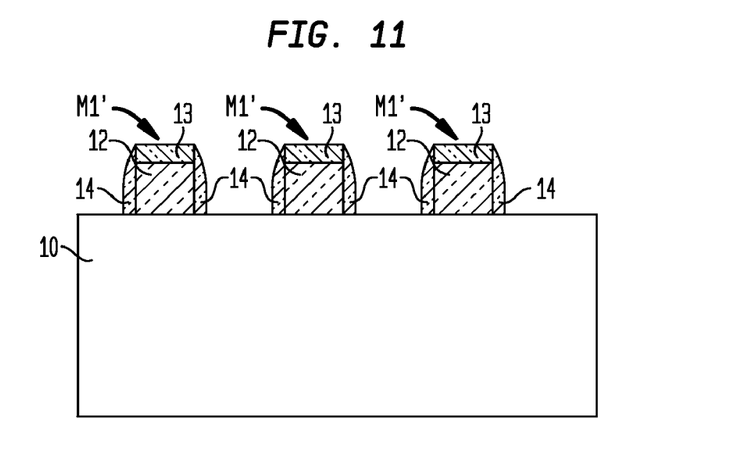
FIG. 11 to FIG. 21 show a series of schematic cross-sectional diagrams illustrating the results of progressive stages in fabricating a semiconductor structure comprising a vertical field effect transistor array in accordance with another embodiment of the invention. This vertical field effect transistor array also comprises a surrounding gate transistor (SGT) array.

FIG. 11 shows a schematic cross-sectional diagram of the semiconductor structure at an early stage in the fabrication thereof in accordance with this other embodiment of the invention.

FIG. 11 is generally similar to FIG. 4, with like structures and layers being designated identically numerically. However, FIG. 11 also illustrates a plurality of second pillar mask layers 13 located aligned upon the plurality of first pillar mask layers 12. The plurality of second pillar mask layers 13 typically comprises a different pillar mask material in comparison with the plurality of first pillar mask layers 12. Generally, the plurality of second pillar mask layers 13 comprises the same material as the plurality of first spacer layers 14. Thus, under circumstances where the first pillar mask layers 12 comprise a silicon oxide material, the second pillar mask layers 13 and the first spacer layers 14 typically comprise a silicon nitride material. Alternative materials selections may also be used for the first pillar mask layers 12, the second pillar mask layers 13 and the first spacer layers 14. Particular silicon oxide materials and silicon nitride materials may be formed using thermal or plasma oxidation or nitridation methods, chemical vapor deposition methods and physical vapor deposition methods that are disclosed within the context of the first embodiment above.

As is also illustrated in FIG. 11, individual sets comprising: (1) a first pillar mask layer 12; (2) a second pillar mask layer 13; and (3) a first spacer layer 14, comprise a first composite mask layer M1'.

Figure 12:
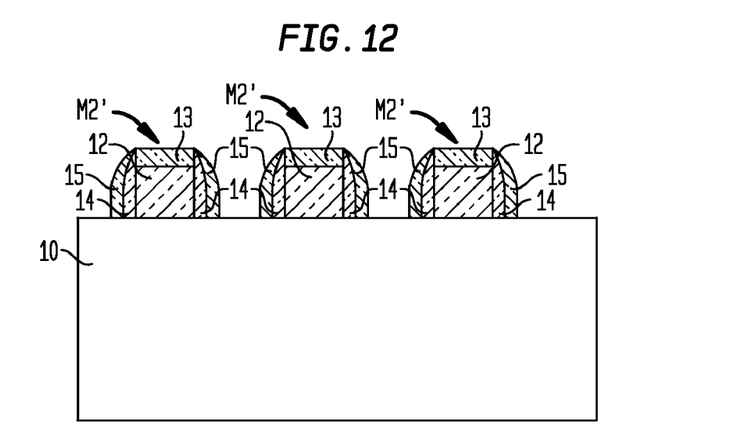

FIG. 12 shows the results of forming a plurality of second spacer layers 15 located upon and covering the first spacer layers 14, to thus provide a plurality of second composite mask layers M2'. The second spacer layers 15 typically comprise a spacer material different from the spacer material from which is comprised the first spacer layers 14. As a particular example, when the first spacer layers 14 comprise a silicon nitride material, the second spacer layers 15 comprise a silicon oxide material, similar to the first pillar mask layers 12. The second spacer layers 15 may be formed using an anisotropic etchback method analogous to the anisotropic etchback method that may be used for forming the first spacer layers 14, with a substitution of a spacer material composition and a selection of an etchant gas composition that preferably has a specificity for a material from which is comprised the second spacer layers 15 in comparison with the second pillar mask layers 13.

Figure 13:
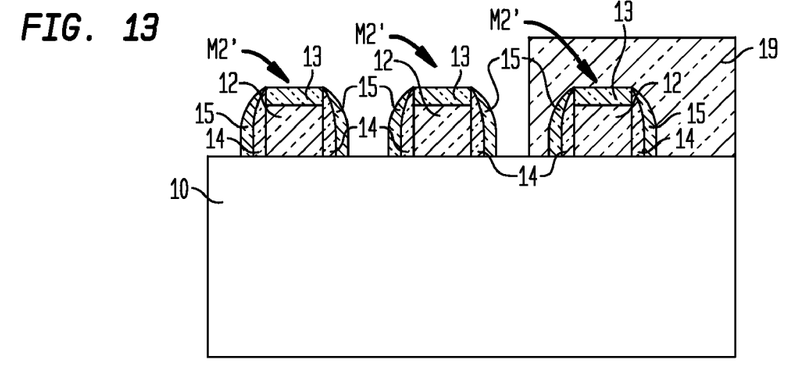

FIG. 13 shows the results of masking the right most second composite mask layer M2' while using a block mask 19 that leaves exposed the left and center second composite mask layers M2'.

The block mask 19 may comprise any of several masking materials. Non-limiting examples include hard mask materials and photoresist mask materials. Non-limiting examples of photoresist mask materials include positive photoresist materials, negative photoresist materials and hybrid photoresist materials. Typically, the block mask 19 comprises a photoresist mask material, although the embodiment is not intended to be so limited. Typically, the block mask 19 has a thickness from about 2000 to about 5000 angstroms. Typically, the block mask 19 need not be formed with particular precision, but rather the block mask 19 needs to effectively mask the right most of the composite second mask layer M2' structures that is illustrated in FIG. 13.

Figure 14:
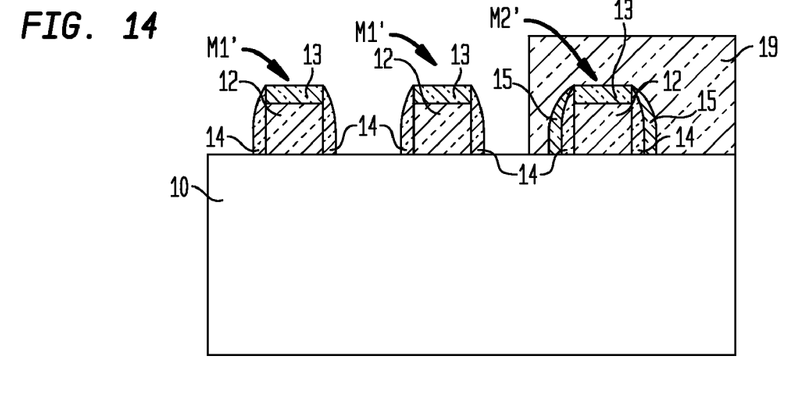

FIG. 14 shows the results stripping the second spacer layers 15 from the left and center second composite mask layers M2' that are illustrated in FIG. 13, to again provide first composite mask layers M1' therefrom. The second spacer layers 15 may be stripped using methods and materials that are conventional in the semiconductor fabrication art. Non-limiting examples include wet chemical etch methods and dry plasma etch methods. Wet chemical etch methods are common and they may be efficiently used when the second spacer layers 15 comprise a silicon oxide material and the first spacer layers 14 comprise a silicon nitride material. Alternatively, plasma etch methods having appropriate specificity are also known and such plasma etch methods may also be used.

Figure 15:
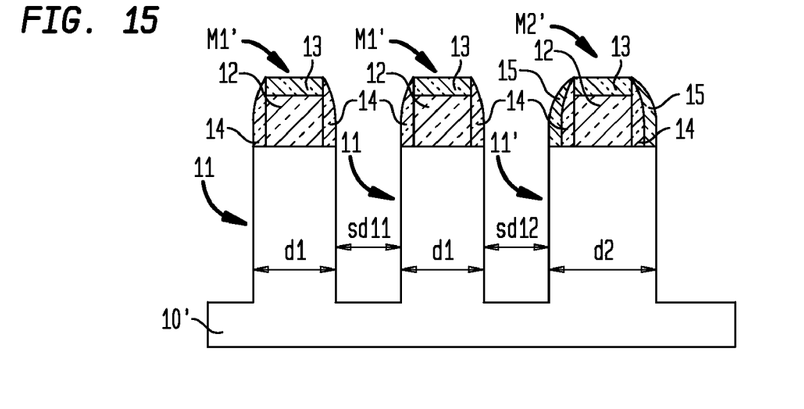

FIG. 15 first shows the results of stripping the block mask 19 from the semiconductor structure whose schematic cross-sectional diagram is illustrated in FIG. 14. The block mask 19 may be stripped using methods and materials that are appropriate to its materials of composition. For a block mask 19 that is formed of a photoresist material, the block mask 19 may be stripped using a wet chemical etch method, a dry plasma etch method or a combination of a wet chemical etch method and a dry plasma etch method.

FIG. 15 also shows the results of etching the semiconductor substrate 10 to provide an etched semiconductor substrate 10' while using the two first composite mask layers M1' and the single second composite mask layer M2' as etch mask layers. Similarly with the first embodiment, semiconductor pillars 11 result from etching the semiconductor substrate 10 while using the first composite mask layers M1 as an etch mask. In addition, semiconductor pillar 11' results from etching the semiconductor substrate 10 while using the second composite mask M2' as an etch mask layer.

Similarly with the foregoing first embodiment, the first semiconductor pillars 11 have a first linewidth d1 that equals F+2s1 (i.e., a minimum photolithographically resolvable linewidth plus two time a first spacer 14 linewidth). In contrast to the first embodiment, the second semiconductor pillar 11' has a second linewidth d2 equal to F+2s1+2s2 (where F equals a minimum photolithographically linewidth, s1 equal a first spacer layer 14 linewidth and s2 equals a second spacer layer 15 linewidth).

Similarly in accordance with the first embodiment, the semiconductor pillars 11 are separated by a distance sd11 equal to F−2s1. A semiconductor pillar 11 is separated from a semiconductor pillar 11' by a separation distance sd12 that equals F−2s1−s2. Finally, although not specifically illustrated in FIG. 15, a semiconductor pillar 11' would be separated from another semiconductor pillar 11' by a separation distance sd22 equal to F−2s1−2s2, where F, s1 and s2 are defined above.

Figure 16:
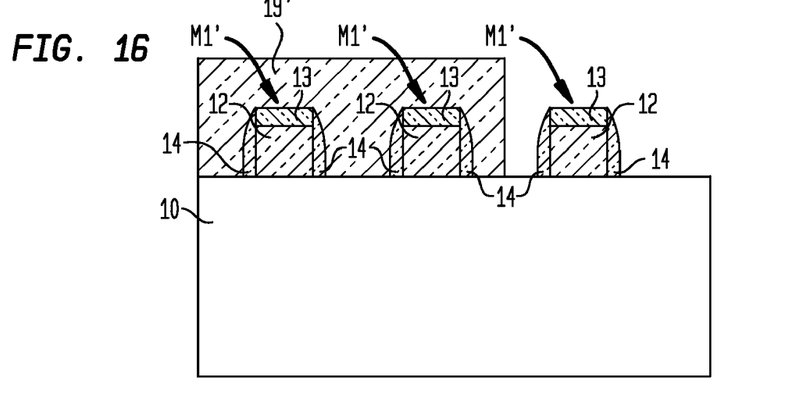

Another embodiment for forming a semiconductor structure related to the semiconductor structure of FIG. 14 masks the left two composite mask layers M1' within the semiconductor structure of FIG. 11 with a block mask 19' to provide a semiconductor structure that is illustrated in FIG. 16. The block mask 19' is otherwise generally analogous to the block mask 19 that is illustrated in FIG. 13 and FIG. 14.

Figure 17:
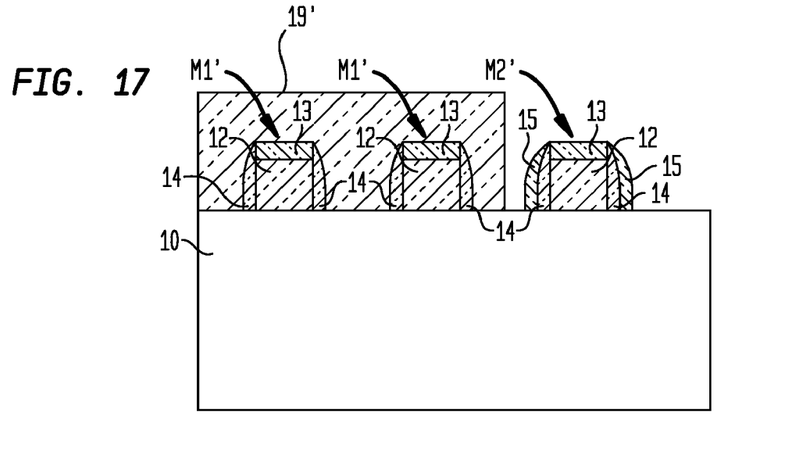
Figure 18:
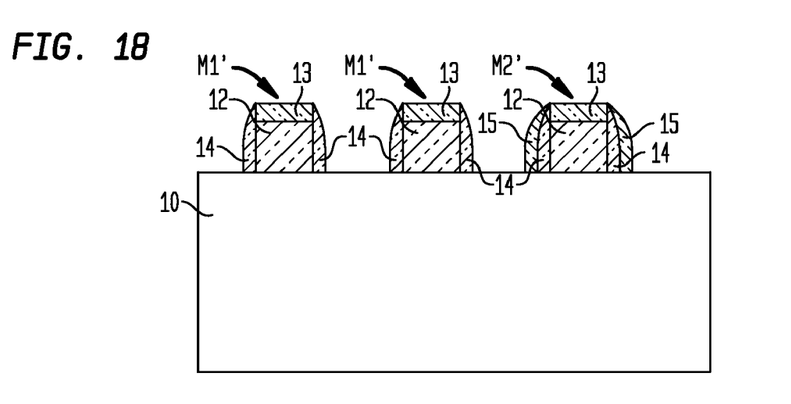

The second spacers 15 may then be formed upon the right most first composite mask layer M1' that is illustrated in FIG. 16 to provide the second composite mask layer M2' that is illustrated in FIG. 17. The block mask layer 19' may then be stripped to provide the semiconductor structure of FIG. 18. Upon etching, the semiconductor structure of FIG. 18 yields the semiconductor structure of FIG. 15.

Figure 19:
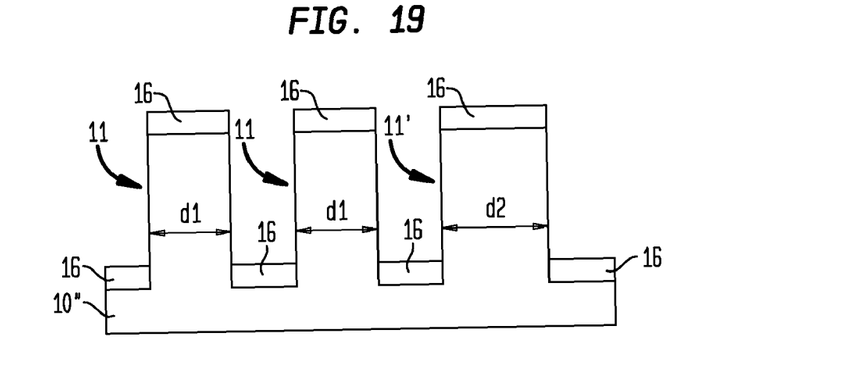
Figure 20:
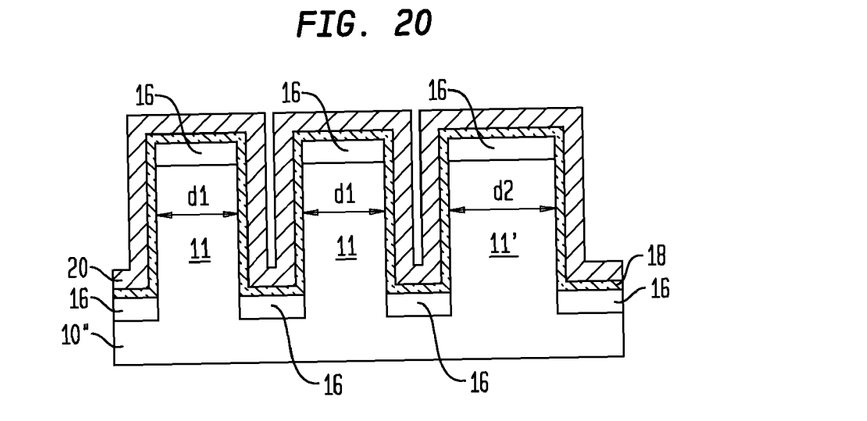
Figure 21:
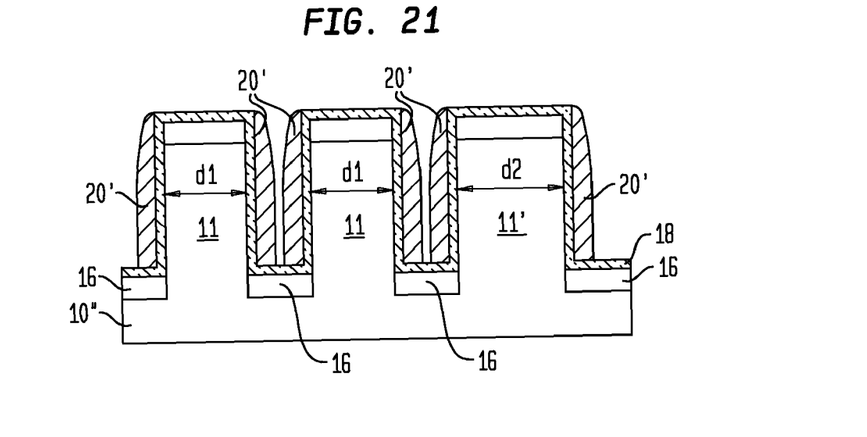

FIG. 19, FIG. 20 and FIG. 21 show the results of further processing of the semiconductor structure of FIG. 15. FIG. 19, FIG. 20 and FIG. 21 follow analogously with FIG. 7, FIG. 8, FIG. 9 and FIG. 10 within the first embodiment. In particular, FIG. 19 (correlating with FIG. 7 and FIG. 8 and related description) first shows the results of stripping the appropriate composite mask layers M1' and M2' from the corresponding semiconductor pillars 11 and 11' within an etched semiconductor substrate 10'. FIG. 19 also shows the results of forming source/drain regions 16 into: (1) semiconductor pillar 11 and 11' tops; and (2) semiconductor substrate 10' regions interposed between adjacent semiconductor pillars 11 and 11'.

Also, FIG. 20 (correlating with FIG. 9) shows the results of forming a gate dielectric 18 upon the semiconductor structure of FIG. 17, and forming a gate electrode material layer 20 upon the gate dielectric 18.

Finally, FIG. 21 (correlating with FIG. 10) shows the results of anisotropically etching the gate electrode material layer 20 to form a plurality of gate electrodes 20'.

FIG. 21 shows a schematic cross-sectional diagram of a semiconductor structure in accordance with a second embodiment of the invention. Similarly with the first embodiment of the invention, the second embodiment also comprises a vertical field effect transistor array, and in particular a surrounding gate transistor (SGT) array.

In contrast with the first embodiment, semiconductor pillars 11 and 11' within the second embodiment have different linewidths (i.e., d1 and d2). The different linewidths result from using a pillar mask layer 12 with either: (1) only a first spacer layer 14; or (2) a first spacer layer 14 and a second spacer layer 15, to provide a corresponding first composite etch mask layer M1' or a corresponding second composite etch mask layer M2', when etching the semiconductor pillars 11 and 11' from a semiconductor substrate 10.

The differences in the semiconductor pillar widths d1 and d2 for the semiconductor pillars 11 and 11' allow for fabrication of a vertical field effect transistor array having multiple vertical field effect transistors having different performance characteristics.

The preferred embodiments of the invention are illustrative of the invention rather than limiting of the invention. Revisions and modifications may be made to methods, materials, structures and dimensions of a semiconductor structure and method for fabrication thereof in accordance with the preferred embodiments of the invention, while still providing a semiconductor structure and method for fabrication thereof in accordance with the invention, further in accordance with the accompanying claims.

What is claimed is:

1. A method for fabricating a vertical field effect transistor array semiconductor structure comprising:
    forming at least one first composite mask having a first diameter on one portion of a semiconductor substrate and at least one second composite mask having a second diameter different from the first diameter on another portion of said semiconductor substrate, wherein said first composite mask comprises a first pillar mask layer, a second pillar mask layer located on an exposed topmost surface of the first pillar mask layer, and a first spacer layer located on sidewall surfaces of the first pillar mask layer and the second pillar mask layer, and said second composite mask comprises another first pillar mask layer, another second pillar mask layer located on an exposed topmost surface of the another first pillar mask layer, another first spacer layer located on sidewall surfaces of the another first pillar mask layer and the another second pillar mask layer, and a second spacer layer located on exposed sidewall surfaces of said another first spacer layer; and
    etching the semiconductor substrate while using the first composite mask and the second composite mask as an etch mask layer to provide a corresponding first semiconductor pillar having a first linewidth and a second semiconductor pillar having a second linewidth different from the first linewidth, wherein each of said first linewidth and said second linewidth is greater than a separation distance from an adjacent semiconductor pillar.

2. The method of claim 1 further comprising forming a first gate dielectric upon the first semiconductor pillar and forming a second gate dielectric upon the second semiconductor pillar.

3. The method of claim 2 further comprising forming a first gate electrode upon the first gate dielectric and surrounding the first pillar and forming a second gate electrode upon the second gate dielectric and surrounding the second semiconductor pillar.

4. The method of claim 1 wherein the etching the semiconductor substrate does not use a sidewall masking of the first semiconductor pillar or the second semiconductor pillar.

5. The method of claim 1 wherein said forming said at least one first composite mask having said first diameter and said second composite mask having said second diameter comprises:
    forming a blanket layer of said first pillar mask layer on a topmost surface of said semiconductor substrate;
    forming a blanket layer of said second pillar mask layer on said exposed topmost surface of the first pillar mask layer;
    patterning the blanket layer of said first pillar mask layer and the blanket layer of said second pillar mask layer;
    forming said first spacer layer by deposition and etching,
    forming said second spacer layer on said sidewall surfaces of said first spacer layer;
    forming a block mask on at least one portion of the semiconductor substrate, wherein said block mask protects said at least one second composite mask;
    removing the second spacer layer in another portion of semiconductor substrate not including said block mask; and
    removing said block mask.

6. The method of claim 5 wherein said removing the second spacer layer comprises a wet chemical etching method.

7. The method of claim 5 wherein said removing the second spacer layer comprises plasma etching.

8. The method of claim 1 wherein said second spacer layer comprises a spacer material that differs from a spacer material of said first spacer layer.

9. The method of claim 1 wherein said first linewidth of said first semiconductor pillar is equal to F+2s1 wherein F is the minimum photolithographic resolvable dimension of a lithographic tool and s1 is the annular linewidth of said first spacer layer.

10. The method of claim 1 wherein said second linewidth of said second semiconductor pillar is equal to F+2s1+2s2 wherein F is the minimum photolithographic resolvable dimension of a lithographic tool, s1 is the annular linewidth of said first spacer layer, and s2 is the annular linewidth of said second spacer layer.

11. The method of claim 1 wherein said first semiconductor pillar is separated from said second semiconductor pillars by a distance equal to F−2s1−s2 wherein F is the minimum photolithographic resolvable dimension of a lithographic tool, s1 is the annular linewidth of said first spacer layer, and s2 is the annular linewidth of said second spacer layer.

12. The method of claim 1 wherein one of said second semiconductor pillar is separated from another of said second semiconductor pillar by a distance equal to F−2s1−2s2 wherein F is the minimum photolithographic resolvable dimension of a lithographic tool, s1 is the annular linewidth of said first spacer layer, and s2 is the annular linewidth of said second spacer layer.

13. The method of claim 1 further comprising:
    forming source/drain regions within an exposed uppermost surface of each of said first and second semiconductor pillars and within base portions of the etched semiconductor substrate, where each neighboring semiconductor pillar shares a common source/drain region at footprints thereof;
    forming a conformal gate dielectric on sidewalls and directly on said exposed uppermost surface of each of said first and second semiconductor pillars, wherein a portion of said conformal gate dielectric extends atop each common source/drain; and
    forming a gate electrode annularly surrounding each of said first and second semiconductor pillars, wherein said gate electrode has an upper surface that is planar with an upper surface of the conformal gate dielectric that is located directly on said exposed uppermost surface of each of said first and second semiconductor pillars.

14. The method of claim 1 further comprising removing said first composite mask and said second composite mask from each of said first and second semiconductor pillars.

15. The method of claim 1 wherein said forming said at least one first composite mask having said first diameter and said second composite mask having said second diameter comprises:

forming a blanket layer of said a first pillar mask layer on a topmost surface of said semiconductor substrate;

forming a blanket layer of said second pillar mask layer on said exposed topmost surface of the first pillar mask layer;

patterning the blanket layer of said first pillar mask layer and the blanket layer of said second pillar mask layer;

forming said first spacer layer by deposition and etching, forming a block mask on at least one portion of the semiconductor substrate, while leaving at least one other portion of the semiconductor substrate exposed;

forming said second spacer layer on said sidewall surface of said first spacer layer within the at least one other portion of the semiconductor substrate; and removing said block mask.

* * * * *